(12) United States Patent
Krupp et al.

(10) Patent No.: US 10,230,207 B2
(45) Date of Patent: Mar. 12, 2019

(54) CONNECTOR REMOVAL TOOL

(71) Applicant: Raytheon Company, Waltham, MA (US)

(72) Inventors: William Krupp, St. Petersburg, FL (US); Kyle Davidson, Palm Harbor, FL (US); Daniel C. Mcgowan, Tampa, FL (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/826,517

(22) Filed: Nov. 29, 2017

(65) Prior Publication Data

US 2018/0159289 A1     Jun. 7, 2018

Related U.S. Application Data

(60) Provisional application No. 62/430,831, filed on Dec. 6, 2016.

(51) Int. Cl.
| | |
|---|---|
| *H01R 11/22* | (2006.01) |
| *H01R 43/26* | (2006.01) |
| *H01R 13/633* | (2006.01) |
| *H05K 13/04* | (2006.01) |
| *H01R 13/635* | (2006.01) |

(52) U.S. Cl.
CPC ......... *H01R 43/26* (2013.01); *H01R 13/6335* (2013.01); *H05K 13/0491* (2013.01); *H01R 13/635* (2013.01)

(58) Field of Classification Search
CPC .. H01R 43/26; H01R 13/6335; H01R 13/635; H05K 13/0491

USPC .................................. 439/153, 266, 372
See application file for complete search history.

(56) References Cited

U.S. PATENT DOCUMENTS

| | | | |
|---|---|---|---|
| 3,951,514 A * | 4/1976 | Medina, Jr. | ............. B25B 27/14 29/758 |
| 4,155,159 A | 5/1979 | Hogan et al. | |
| 4,425,704 A | 1/1984 | Cline | |

(Continued)

FOREIGN PATENT DOCUMENTS

| | | |
|---|---|---|
| JP | H02 130770 U | 10/1990 |
| TW | M339127 U | 8/2008 |

OTHER PUBLICATIONS

International Search Report for International Application No. PCT/US2017/03805 dated Feb. 5, 2018, 15 pages.

(Continued)

*Primary Examiner* — Khiem Nguyen

(57) ABSTRACT

A connector removal tool comprising a rigid press and release device for removing a connector from an electronics assembly. Upon engagement of the rigid press and the release device, first and second press members of the rigid press engage and move about a pair of deflecting engagement members of the release device to cause the pair of deflecting engagement members to deflect to compress and unlock interlocking tabs of the connector to facilitate removal from the electronics assembly. A single motion of the rigid press can cause unlocking of the connector. Alternatively, a connector removal tool comprises biased deflecting rigid press members that engage directly with a connector to unlock the interlocking tabs of the connector to facilitate removal of the connector from an electronics assembly.

22 Claims, 10 Drawing Sheets

(56) References Cited

U.S. PATENT DOCUMENTS

| | | | |
|---|---|---|---|
| 4,858,309 | A | 8/1989 | Korsunsky et al. |
| 5,210,934 | A | 5/1993 | Lenzi et al. |
| 6,047,464 | A | 4/2000 | Chadbourne et al. |
| 6,202,295 | B1 | 3/2001 | Easter et al. |
| 6,363,560 | B1 | 4/2002 | Kesinger |
| 6,785,460 | B2 | 8/2004 | de Jong et al. |
| 7,017,259 | B2 | 3/2006 | Aoki |
| 7,020,376 | B1 | 3/2006 | Dang et al. |
| 2004/0218885 | A1 | 11/2004 | Segroves et al. |
| 2006/0270256 | A1 | 11/2006 | Huss, Jr. |
| 2007/0011857 | A1* | 1/2007 | Francis .............. H01R 43/26 29/426.5 |
| 2012/0079715 | A1 | 4/2012 | Chen |
| 2013/0263444 | A1 | 10/2013 | Lo et al. |

OTHER PUBLICATIONS

Office Action for Taiwan Application No. 106142538 dated Aug. 22, 2018, 11 pages.

* cited by examiner

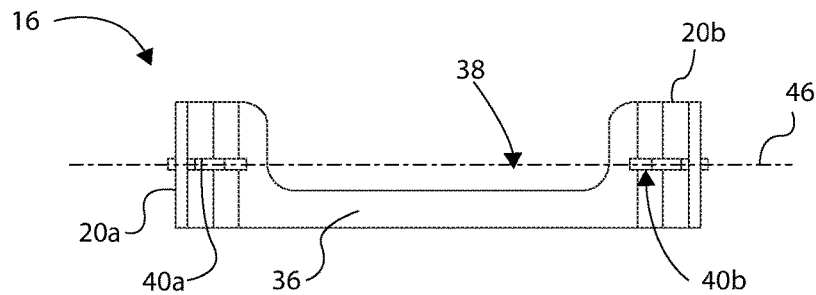
*FIG. 3A*
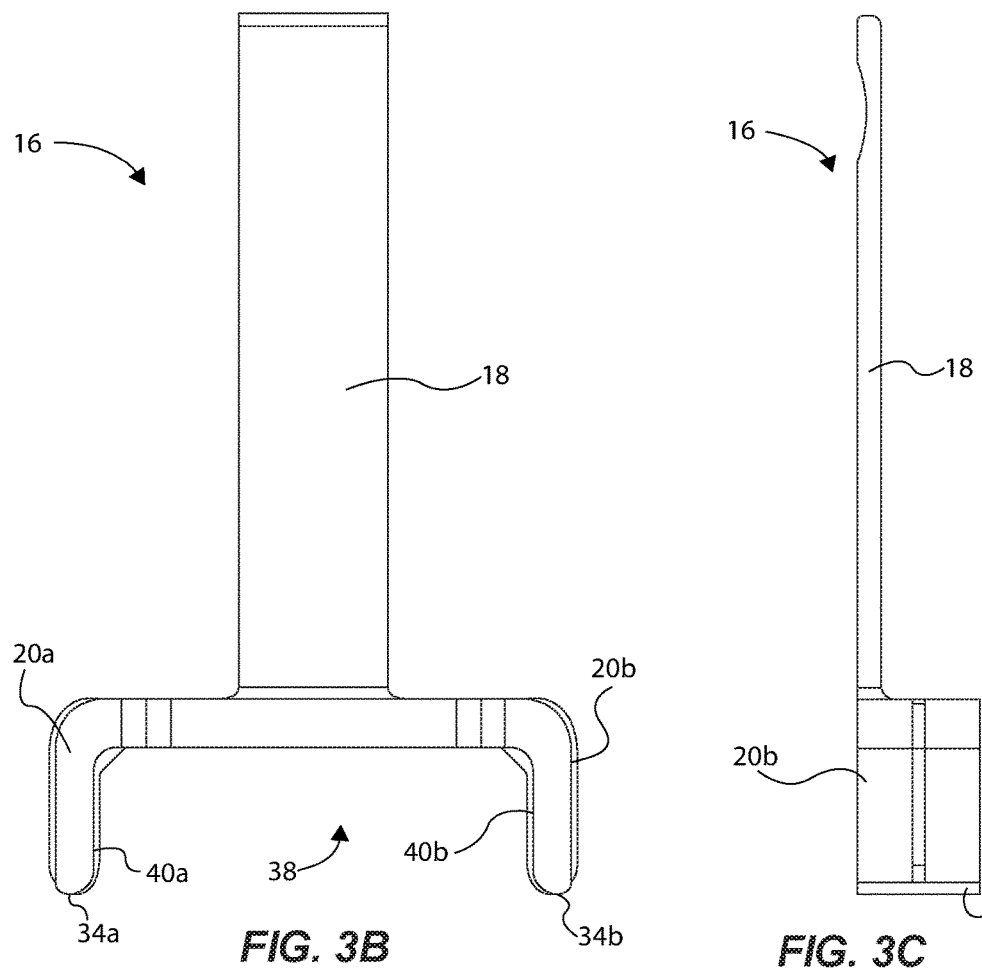
*FIG. 3B*  *FIG. 3C*

CONNECTOR REMOVAL TOOL

RELATED APPLICATION

This application claims the benefit of U.S. Provisional Application Ser. No. 62/430,831, filed Dec. 6, 2016, and entitled, "Connector Removal Tool," which is incorporated by reference in its entirety herein.

BACKGROUND

Electrical connectors are often fit into an electronics assembly in close proximity to other components, which can make it difficult to remove the connectors with a hand and without causing damage to the connectors. In particular, one such connector is a press-fit connector that requires compression of interlocking tabs located on the sides of the connector for removal of the connector from an electronics board or other electronics assembly. Improper removal can cause damage to the interlocking tabs, the connector interface, or the connected circuit board of the electronics assembly, or all of these, any of which can be costly and difficult to repair or replace in many instances. Typically, such connectors are removed manually. For removal, the connector interlocking tabs must be depressed fully before the connector can be pulled from its connection, or there is a risk of damage. However, in many cases due to the limited and cramped available space surrounding the connector, the interlocking tabs may not always be compressed fully (i.e., there is a lack of consistency in depressing the interlocking tabs at the same time or in the same direction or with the same force, which can be problematic and lead to the damage of the connector or the circuit board once forces used to pull the connector from its connected state are exerted on the connector.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 3A is a bottom view of the rigid press of the connector removal tool of FIG. 1A.

FIG. 3B is a front view of the rigid press of the connector removal tool of FIG. 1A.

FIG. 3C is a left side view of the rigid press of the connector removal tool of FIG. 1A.

Figure 1A:
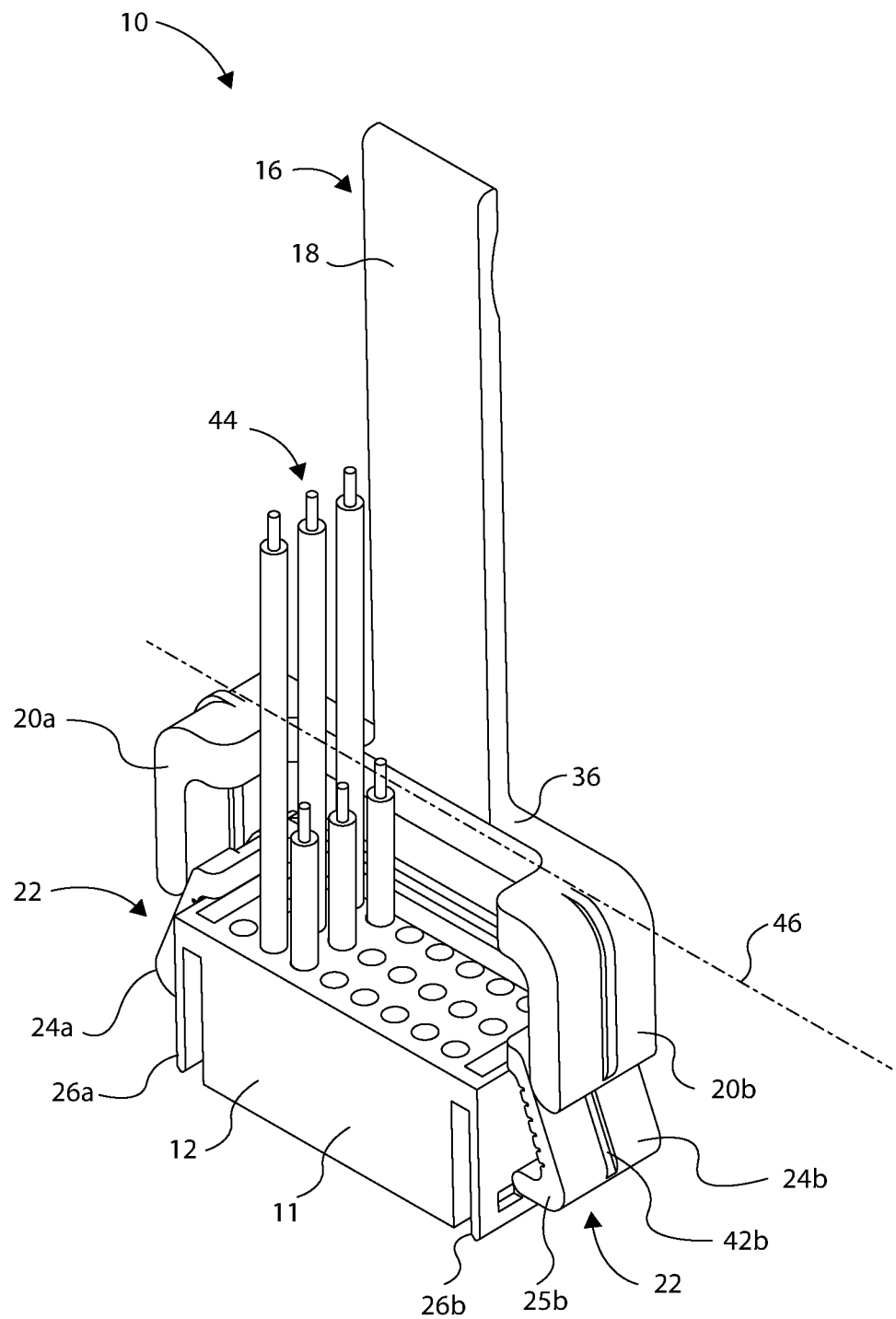
FIG. 1A is an isometric view of a connector removal tool engaged to a connector in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly, but is not intended to identify key features or essential features of the technology, nor is it intended to limit the scope of the claimed subject matter.

The present disclosure sets for a connector removal tool for removing a connector (e.g., but not limited to, a Positronic PLC24M0000 connector) from an electronics assembly (e.g., but not limited to, a circuit board assembly) in one example. The connector removal tool can comprise a rigid press having a handle portion, and first and second press members supported about the handle portion. A release device can be engageable with the rigid press, and can have a pair of deflecting engagement members. The rigid press is operable to engage the release device and to cause the first and second press members to interface with and move about the pair of deflecting engagement members, such that the rigid press applies a press force to the release device sufficient to cause the pair of deflecting engagement members to deflect inwardly towards one another in an opposing manner, the release device being operable to compress or depress a pair of interlocking tabs of the connector with sufficient force to unlock them, thus facilitating release of the connector from an electronics assembly.

In one example, the pair of deflecting engagement members are each bendable along an axis and sufficiently compliant to maintain an inward horizontal displacement direction upon movable engagement with the rigid press.

The present disclose further sets forth an example connector removal tool for removing a connector from an electronics assembly in one example. The connector removal tool can comprise a rigid press having a handle portion and a support bridge; a first deflecting press member and a second deflecting press member pivotally supported about the support bridge in an opposing position relative to one another; a first coupling pivot device operable with the first deflecting press member; a second coupling pivot device operable with the second deflecting press member, wherein the first and second coupling pivot devices bias the first and second deflecting press members toward one another, respectively. The rigid press is operable to engage directly with a connector coupled to an electronics assembly, such that the first and second deflecting press members interface with and compress respective interlocking tabs of the connector with sufficient force to remove the connector from an electronics assembly. In some examples, the deflecting press members can further comprise rollers to provide a rotatable interface of the deflecting press members with the connector.

A method of removing a connector from an electronics assembly using a connector-remover tool can comprise positioning a release device about a connector removably coupled to an electronics assembly. The release device can have a pair of deflecting engagement members interfaced with a pair of interlocking tabs of the connector. The method can comprise engaging a rigid press with the release device. The rigid press can comprise first and second press members movably engaged with the pair of deflecting engagement members of the release device. The method can comprise pressing the rigid press onto the release device toward the connector, such that the first and second press members move about the pair of deflecting engagement members and cause inward deflection of the pair of deflecting engagement members to compress the interlocking tabs of the connector with sufficient force to unlock the interlocking tabs from an electronics assembly and to facilitate removal of the connector from the electronics assembly.

FIGS. 1A-5C illustrate a connector removal tool 10 for removing a connector 12 from an electronics assembly 14 (or from any substrate or structure), in accordance with an example of the present disclosure. The connector removal tool 10 can comprise a rigid press 16 having a handle portion 18, and first and second press members 20a and 20b supported by the handle portion 18. The connector removal tool 10 can further comprise a release device 22 that interfaces and engages with the rigid press 16 and the connector 12. The rigid press 16 and the release device 22 can operate together to facilitate removal of the connector 12. The release device 22 can comprise a pair of deflecting engagement members 24a and 24b configured to pinch or compress or depress a pair of interlocking tabs 26a and 26b on the connector 12, thereby unlocking these to enable removal of the connector 12 from the electronics assembly 14 upon operation of the connector removal tool 10, as further detailed below.

More specifically, in this example, the rigid press 16 and the release device 22 comprise separate components that engage with one another by causing the rigid press 16 to slidably engage with and apply a force to the release device 22. To engage the rigid press 16 with the release device 22, the rigid press 16 can be aligned with and brought in to contact with the release device 22, such that first and second press members 20a and 20b of the rigid press 16 come in contact and interface with the pair of deflecting engagement members 24a and 24b of the release device 22. And, upon pressing the press member 16 a further distance toward the release device 22 in the direction of arrow D, the first and second press members 20a and 20b can slide along the respective deflecting engagement members 24a and 24b, wherein the rigid press exerts a force on the release device, and specifically the first and second press members 20a and 20b exert a force on the deflecting engagement members 24a and 24b, thereby causing them each to deflect inwardly in the directions Ca and Cb shown by respective arrows. This creates a pinching or depression effect on interlocking tabs 26a and 26b of the connector 12. As the rigid press 16 is brought down further on the release device 22, the deflecting engagement members 24a and 24b can be depressed a distance sufficient to cause the interlocking tabs 26a and 26b to unlock from the electronics assembly 14, as shown on FIG. 1C.

The connector 12 can be a press-fit type connector having interlocking tabs 26a and 26b that oppose each other on either ends or sides of the connector 12, and that can be press-fit or snap-fit into a slot of a circuit board, for instance, to electrically connect wires supported by the connector 12 to terminals of the circuit board. The connector 12 can be any number of known such connectors of any size and configuration comprising opposing interlocking tabs that are pinchable or compressible to unlock these for removal of the connectors from a substrate, structure, electronics device, or other electronics assembly as will be recognized by those skilled in the art.

It is noted that with respect to the various example connector removal tools discussed herein, one example of a connector type that can be removed with these removal tools is the Positronic PLC24M0000 connector, as well as the different sized connectors in the family of such Positronic connectors. These specific types of connectors are not meant to be limiting in any way. Indeed, those skilled in the art will recognize other connector types that can be removed with the connector removal tools discussed herein. Accordingly, the different example connector removal tools discussed herein, as well as their equivalents, may be sized and configured appropriately to fit over and remove a variety of connector types of different sizes and configurations.

The rigid press 16 can be comprised of a rigid material, such as plastics, polymers, metals, composites, and others, or a combination of any of these, and even semi-rigid materials in some instances. The release device 22 can be comprised of rigid or semi-rigid material, with the release device 22 being configured to move in a suitable manner so as to be able to effectively depress the interlocking tabs of a connector to be removed. In some examples, the release device can comprise a compliant material or a compliant mechanism, and can be comprised of plastics, polymers, composites, rubbers, metals, and others, or a combination of these. Thus, the release device 22 can be sufficiently compliant (or elastic) to allow inward deflection of the pair of deflecting engagement members 24a and 24b (and outward deflection of these to a normal state when the release device 22 is released from the rigid press 16), but at the same time is configured to comprise sufficient structural integrity to withstand the pressures and forces applied via the press device 16, as well as to be able to depress the interlocking tabs of the connector. Many available plastics or polymers are suitable for such functionality when shaped or formed in the various examples shown and discussed in the present disclosure. In other examples, the release device 22 can be formed of a rigid material, with the deflecting engagement members 24a and 24b effectively "hinged" to the non-deflecting components of the release device 22.

Figure 1B:
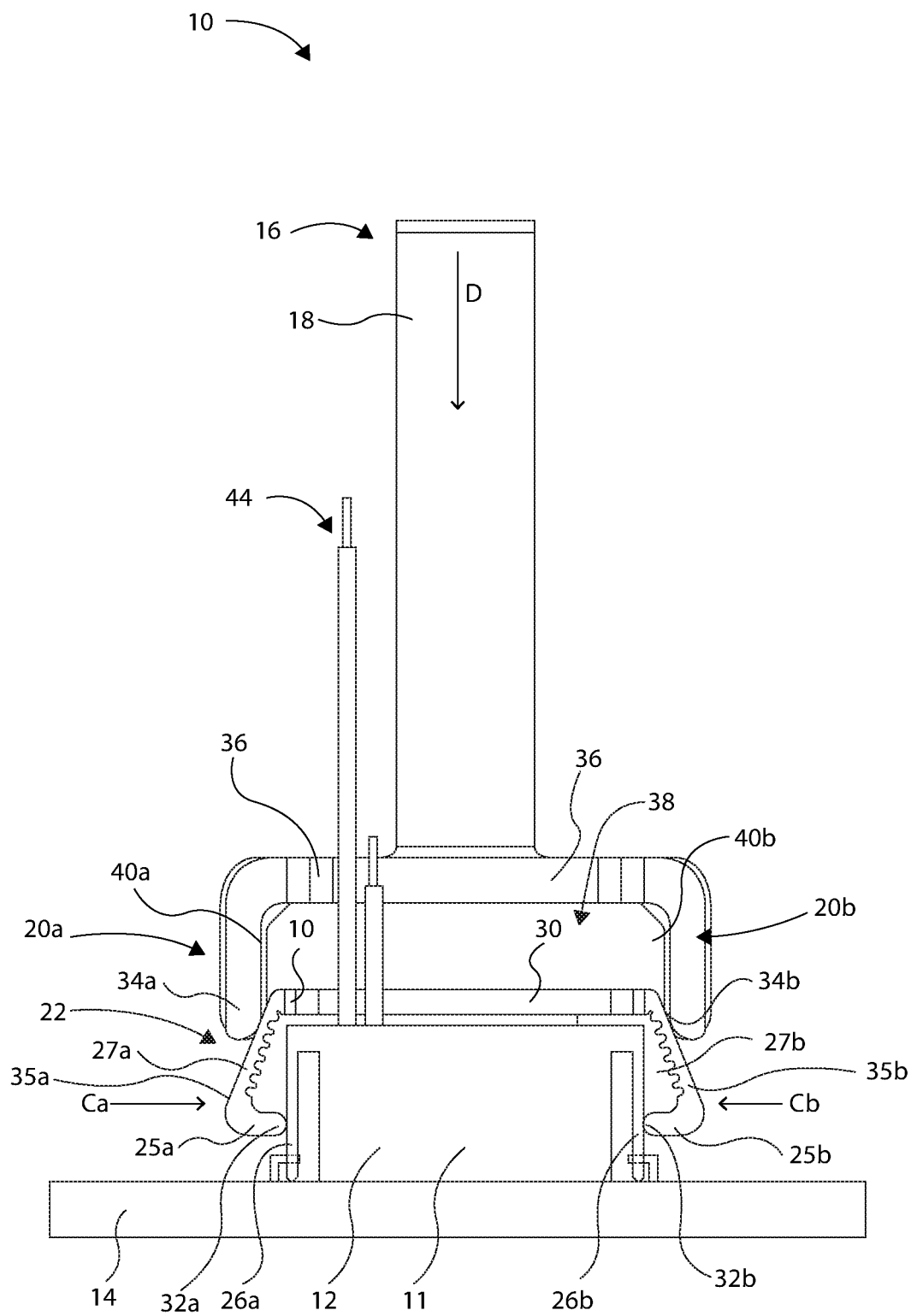
FIG. 1B is a front view of the connector removal tool of FIG. 1A engaged to the connector that is removably locked to an electronics assembly.

More specifically regarding operation of the connector removal tool 10, the deflecting engagement members 24a and 24b of the release device 22 can comprise first and second jaw members 25a and 25b (or connector interface members) formed inwardly about ends of respective deflecting engagement members 24a and 24b (i.e., extending inwardly from the ends of the deflecting engagement members 24a and 24b toward the interlocking tabs 26a and 26b, as viewed from the perspective and orientation of the elements shown in FIG. 1B). The jaw members 25a and 25b can interface with the interlocking tabs 26a and 26b of the connector 12 when engaged to the connector 12. In one example, the jaw members 25a and 25b can each have respective rounded or curved interface surfaces 32a and 32b (FIGS. 1B and 5A) that engage with outer surface portions of respective interlocking tabs 26a and 26b. These curved interface surfaces 32a and 32b can allow the jaw members 25a and 25b to rotate or slide, or both, along the respective interlocking tabs 26a and 26b as the engagement and application of the rigid press 16 with/to the release device 22 causes the deflecting engagement members 24a and 24b to pivot and to deflect, which pivoting motion is discussed in more detail below. Deflecting the deflecting engagement members 24a and 24b can cause the jaw members 25a and 25b to each travel in a direction towards the connector and toward each other (e.g., inwardly as viewed in FIGS. 1B and 1C) and to pinch the connector 12, and particularly the interlocking tabs 26a and 26b. In some examples, the path the jaw members 25a and 25b travel can comprise an arcuate path. In other examples, the release device 22 can be configured, such that the jaw members 25a and 25b are caused to travel a linear path, namely the jaw members 25a and 25b can be caused to deflect in a linear, non-rotating manner along an axis towards the connector 12 (e.g., translate along an axis, such as an axis normal to a plane of the surface of the connector 12 (and specifically a surface of the interlocking tabs 26a and 26b) that the jaw members 25a and 25b contact). In any event, the motion of the release device 22 can at least to some degree mimic the pinching motion of a human thumb and index finger that would normally pinch and remove the connector 12 if it were manually released and removed, but with a greater degree of ease, as well as a greater degree of access, accuracy, consistency and repeatability.

The press members 20a and 20b of the rigid press 16 can similarly have curved interface surfaces 34a and 34b (see specifically FIGS. 1B-3C) that can slidably engage with outer planar surfaces 35a and 35b (see specifically FIGS. 4-5C) of the release device 22 upon movement of the rigid press 16 relative to the release device 22. The rigid press 16 can have an middle portion (otherwise referred to as a support bridge) 36 that extends between the press members 20a and 20b, and that supports the handle portion 18 (the handle portion being formed integrally with the middle portion or support bridge 36 or formed separately (i.e., coupled or otherwise joined to the middle portion or support bridge 36)). The press members 20a and 20b can be configured to extend away from the support bridge 36. In the example shown (and with the rigid press oriented in the position shown in FIG. 3B), the press members 20a and 20b can be configured to extend downwardly from, and can be formed integral with, the support bridge 36 (or, alternatively, they can be formed separately from and coupled to or otherwise joined with the support bridge 36). The press members 20a and 20b can be formed generally parallel to each other and spaced apart at a distance sufficient to engage and operate with the release device 22 as discussed herein.

Thus, the press members 20a and 20b can generally define an opening 38 that forms a "female" interface and that is sized and configured to receive the release device 22, which forms a "male" interface. Thus, in this example, the connector removal tool 10 can comprise a two-piece design (rigid press 16 and release device 22), wherein the rigid press 16 and the release device 22 operate together to facilitate removal of the connector 12.

The release device 22 can comprise a middle portion 30 (otherwise also referred to as a support bridge) spanning or extending between the deflecting engagement members 24a and 24b, wherein the support bridge 30 operates to support the deflecting engagement members 24a and 24b in a proper position and orientation, as well as to provide an anchor or base for the deflecting engagement members 24a and 24b. The support bridge 30 can further comprise an alignment member 31 (FIG. 5A) extending from the support bridge 30, such as a lateral flange or edge portion that is configured to and that operates to seat onto an edge of the connector 12 to help self-align the release device 22 with the connector 12 as the release device 22 is brought into contact with and engages the connector 12, thereby positioning the first and second jaws 25a and 25b in the proper position to appropriately interface with and engage the interlocking tabs 26a and 26b on the connector 12. The support bridge 30 can further comprise an interface surface 33 (FIG. 5A) formed along an inside or lower portion of the support bridge 30, which interface surface 33 is sized and configured to seat against an upper surface of the connector 12 when the release device is engaged with the connector 12. This interface surface 33 operates to provide resistance against undesirable movement of the release device 22 when being pressed by the rigid press 16, because the connector 12 is used as somewhat of an anchor point against which the release device 22 is seated, while the deflecting engagement members 24a and 24b of the release device 22 are moved or deflected as the rigid press 16 is pressed against them. The alignment member 31 and the interface surface 33 can extend along respective planes that intersect one another (e.g., the alignment member 31 and the interface surface 33 can comprise or define surfaces that are orthogonal to one another).

Figure 4:
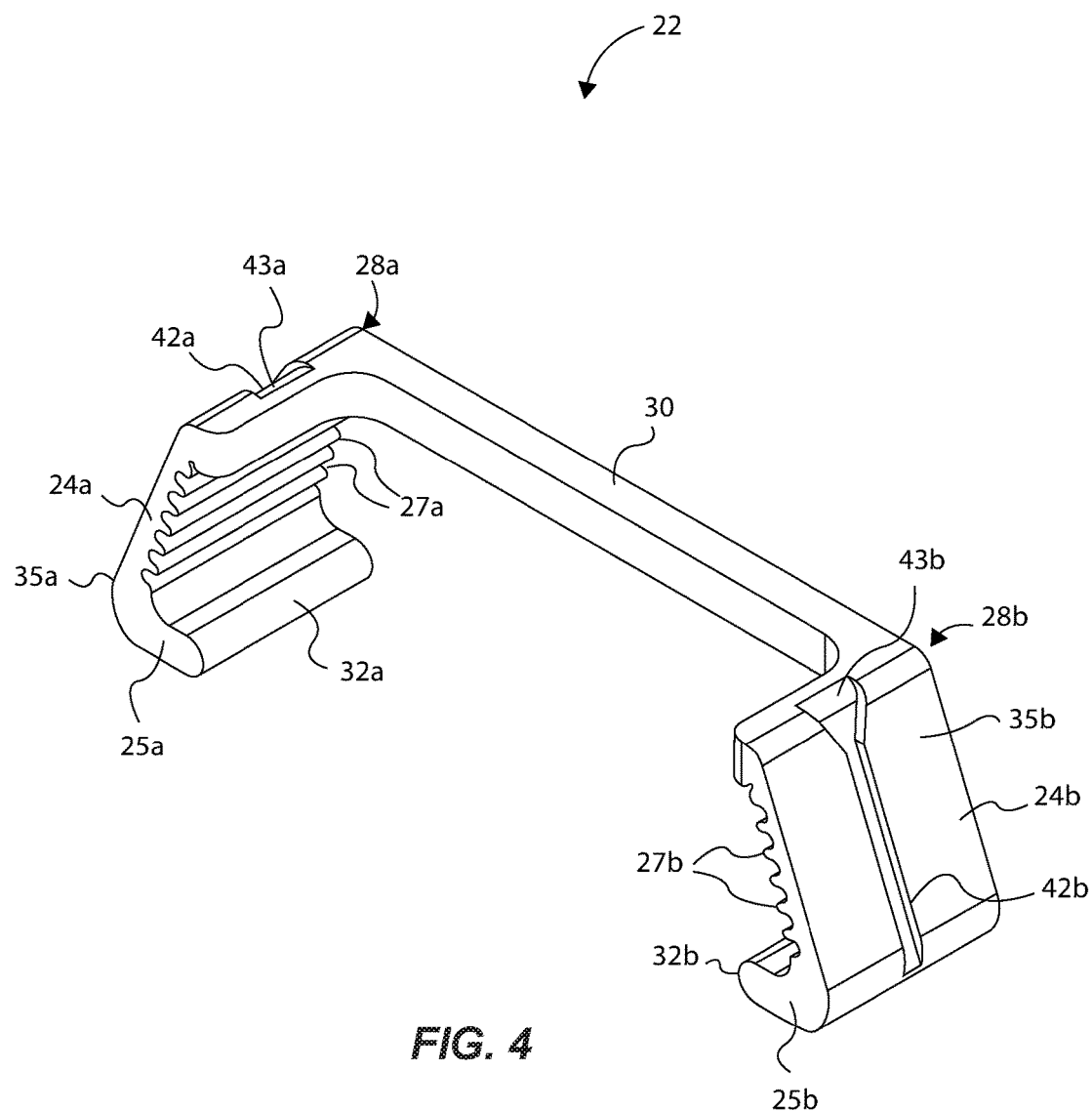
FIG. 4 is an isometric view of the release device of the connector removal tool of FIG. 1A.
Figure 5A:
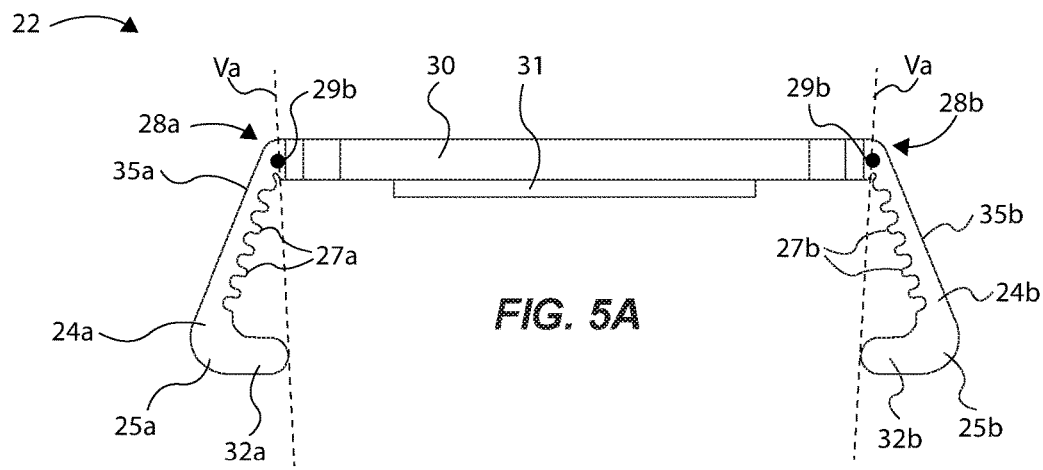
FIG. 5A is a front view of the release device of the connector removal tool of FIG. 1A.
Figure 5B:
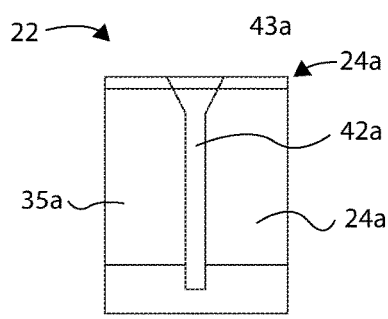
FIG. 5B is a side view of the release device of the connector removal tool of FIG. 1A.
Figure 5C:
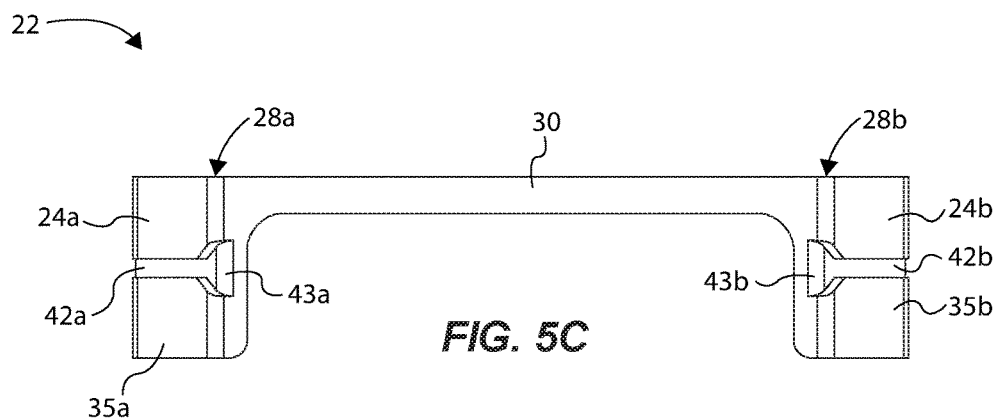
FIG. 5C is a top view of the release device of the connector removal tool of FIG. 1A.

With particular reference to FIGS. 4-5C, the release device 22 can comprise corner portions 28a and 28b formed between respective end portions of the support bridge 30 and the respective deflecting engagement members 24a and 24b. The corner portions 28a and 28b can define respective pivot points 29a and 29b (FIG. 5A), which comprise the points at which the respective deflecting engagement members 24a and 24b rotate or pivot (relative to the support bridge 30) upon being pressed by the press members 20a and 20b of the rigid press 16. In some examples, the corner portions 28a and 28b can have reduced or recessed cross sectional areas to further facilitate such rotation, which reduces the stress at the corner portions 28a and 28b.

Various features of the release device 22 contribute to the deflectable and compliant nature of the deflecting engagement members 24a and 24b, when engaged and pressed by the rigid press 16, to facilitate removal of the connector 12. In one aspect, the deflecting engagement members 24a and 24b can extend from the middle portion or support bridge 30 along diverging axes, or axes that are on an incline relative to a longitudinal axis of the support bridge 30. In other words, the deflecting engagement members 24a and 24b can be oriented on an incline relative to the middle portion or support bridge 30 (in the disengaged, non-deflected position). In the example shown, and with the release device being oriented as shown in FIG. 5A, the deflecting engagement members 24a and 24b can be supported about respective ends of the middle portion or support bridge 30, and can extend in a downward and outward direction from the middle portion or support bridge 30, or along diverging axes. The jaw members 25a and 25b, respectively, can be supported about, and can extend in an inward direction from, respective free ends of the deflecting engagement members 24a and 24b (i.e., the free ends being the ends opposite those interfacing with the support bridge 30). In this configuration, the release device 22 can comprise a wedge-shape configuration, wherein each deflecting engagement member 24a and 24b can extend downwardly and outwardly from respective corner portions 28a and 28b, with jaw members 25a and 25b extending inward, such that a front-view or vertical profile of the release device 22 is generally shaped as a wedge (or at least a partial wedge-shape). This wedge-shaped configuration provides sufficient clearance for the release device 22 and its deflecting engagement members 24a and 24b and jaw members 25a and 25b to interface with (i.e., fit over) the connector 12, as well as to ensure sufficient clearance for the jaw members 25a and 25b to be positioned adjacent the interlocking tabs 26a and 26b of the connector 12, such that they can be caused to displace inwardly to compress and unlock the interlocking tabs 26a and 26b when deflected. This is because the release device 22 is formed having respective pivot points 29a and 29b positioned generally along respective general vertical planes Va and Vb shown as extending through pivot points 29a and 29b and tangent to the respective curved interface surfaces 32a and 32b, as shown on FIG. 5A. Therefore, upon pressing the press device 16 onto the release device 22, and with the jaw members 25a, 25b (e.g., with curved interface surfaces 32a and 32b) adjacent to or interfaced with respective interlocking tabs 26a and 26b, the deflecting engagement members 24a and 24b can be caused to pivot inward about respective pivot points 29a and 29b. As a result, each of the respective jaw members 25a and 25b translate inwardly toward one another beyond the respective vertical planes Va and Vb a distance sufficient to act on the respective interlocking tabs 26a and 26b to release or unlock these from the electronics assembly 14, wherein the connector 12 can be removed from the electronics assembly 14.

Upon disengaging the rigid press 16 from the release device 22, the deflecting engagement members 24a and 24b can spring-back to their original position of FIG. 1B due to the compliant or elastic nature of the deflecting engagement members 24a and 14b. Thus, the release device 22 can automatically move to a nominal, open position for re-use to remove another connector.

As another example feature that contributes to the compliant or deflecting nature of the deflecting engagement members 24a and 24b, each of the deflecting engagement members 24a and 24b can be configured to be pliable and bend (i.e., made of a somewhat pliable semi-rigid material (a material capable of bending a certain degree under an applied load or force along a longitudinal axis of the deflecting engagement members 24a, 24b, yet still able to apply a force to the interlocking tabs 26a, 26b)). In one example, the deflecting engagement members 24a and 24b can comprise reduced area sections formed along an inner area or surface of the respective deflecting engagement members 24a and 24b. In one example, as shown, the reduced area sections can comprise a series of ribs 27a and 27b formed laterally along an inner surface of the deflecting engagement members 24a and 24b). The ribs 27a and 27b form a "variable cross sectional area" (along a generally longitudinal axis). The reduced area sections and the variable cross-sectional area configuration (e.g., the ribs) of the deflecting engagement members 24a and 24b can facilitate bending of the deflecting engagement members 24a and 24b (i.e., can make the deflecting engagement members 24a and 24b more pliable), such that the deflecting engagement members 24a and 24b can slightly bend while also pivoting inwardly towards one another about the pivot points 29a and 29b. This "variable cross-sectional area" facilitates inward compliance and bending deflection of the deflecting engagement members 24a and 24b, because tension about the inner surface of the deflecting engagement members 24a and 24b is less than the tension about the outer surface of the deflecting engagement members 24a and 24b. This can cause each deflecting engagement member 24a and 24b to bend about an arc when deflected inwardly and when pivoted about pivot points 29a and 29b, which allows the jaw members 25a and 25b to travel along a substantially linear or horizontal path while compressing the interlocking tabs 26a and 26b (see e.g., FIGS. 1B and 1C). More specifically, with the deflecting engagement members 24a and 24b comprising reduced cross-sectional area sections, the deflecting engagement members 24a and 24b are subject to bending upon the rigid press 16 engaging with the release device 22. As the rigid press 16 is pressed onto the release device 22, the press members 20a and 20b act on the deflecting engagement members 24a and 24b, wherein the bending of the deflecting engagement members 24a and 24b operates to reduce or eliminate any rotational movement of the jaw members 25a and 25b, and to cause the jaw members 25a and 25b to displace toward one another along more of a linear path than they might otherwise travel if the deflecting engagement members 24a and 24b were rigid. This maximizes the amount of force translated from the press members 20a and 20b to the respective deflecting engagement members 24a and 24b, because the translated force is generally lateral and inward (as opposed to losing some amount of force if the jaws 25a and 25b happen to slightly upwardly or downwardly rotate as they are caused to exert a force against the interlocking tabs 26a and 26b). This also reduces the likelihood that the deflecting engagement members 24a and 24b would fracture or fail due to repeated connector-removal operations due to the force applied by the rigid press 16, because the deflecting engagement members 24a and 24b can slightly bend or deflect (like a leaf spring) about a central area of each deflecting engagement members 24a and 24b, which helps to absorb the force applied by the rigid press 16 when pressed downwardly onto the release device 22. Such "variable cross-sectional area" can be formed by a variety of slots, recesses, chamfers, or other features that may vary the thicknesses of the deflecting engagement members 24a and 24b to facilitate such bending and deflection motion.

In one example, a displacement distance of each of the deflecting engagement members 24a and 24b when deflected inwardly can be substantially proportionate to a displacement distance of the rigid press 16 when pressed onto the release device 22. That is, a downward linear distance moved by the rigid press 16 can be substantially proportionate to an inward linear displacement distance of each of the deflecting engagement members 24a and 24b when deflected by the rigid press 16. It should be appreciated throughout this disclosure that the terms "downward" or "inward" or "outward" or "up" or "down" or "vertical" or "horizontal" are merely examples of possible directions with reference to the orientation of the connector removal tool 10 illustrated in the drawings, and in instances where the connector removal tool 10 is positioned generally in a vertical orientation and operable to be moved in a downward direction to engage a connector. Those skilled in the art will recognize that different connectors can be coupled to different electronics assemblies in any position and orientation in three-dimensional space, in which cases the connector removal tool 10 will likewise be oriented in a corresponding orientation for removal of the connector.

In some examples, the connector removal tool 10 can comprise an alignment system to optimize the interface and alignment between the rigid press 16 and the release device 22. The alignment system can be operable to assist with initial and continuous alignment of the rigid press 16 relative to the release device 22 as these are caused to engage and operate or function with one another. In one example, the alignment system can comprises a tongue-and-groove type of interface or configuration. For instance, an inside surface of one or both of the press members 20*a* and 20*b* can comprise a protrusion in the form of a rail or tongue extending upward therefrom (see tongues 40*a* and 40*b* (FIGS. 1B and 2A)) a given distance. In addition, the respective outer surfaces of the deflecting engagement members 24*a* and 24*b* can comprise channels or grooves formed therein (e.g., see grooves 42*a* and 42*b* (FIGS. 3A and 3B) extending linearly and vertically along the outer surfaces of the deflecting engagement members 24*a* and 24*b*), that are sized, configured and positioned to correspond to the size, configuration and position of the tongues 40*a* and 40*b* of the press members 20*a* and 20*b*. The grooves 42*a* and 42*b* can be slightly thicker/wider than the tongues 40*a* and 40*b*, such that the grooves 42*a* and 42*b* can suitably receive and accommodate the tongues 40*a* and 40*b*, thus facilitating alignment of the rigid press 16 to the release device 22 as the rigid press is pressed onto the release device 22. The alignment system can be configured to facilitate a slidable interface between the rigid press 16 and the release device 22.

In operation, upon engaging and pressing the release device 22 with/onto the connector 12, the tongues 40*a* and 40*b* of the rigid press 16 can be slidably aligned with and inserted into the grooves 42*a* and 42*b* of the release device 22. This functions to align the rigid press 16 relative to the release device 22 so that the jaws 25*a* and 25*b* can uniformly compress the interlocking tabs 26*a* and 26*b* to ensure proper compression and release or unlocking of the interlocking tabs 26*a* and 26*b* of the connector 12 from the electronics assembly 14. This also ensures consistent movement of the rigid press 16 relative to, and along, the release device 22 so that the rigid press 16 does not slip or slide about the release device 22 when the two are pressed together. This also ensures that all or most of the downward pressing forces exerted by the rigid press 16 are transferred to the release device 22 evenly and consistently, so that such transferred forces can be uniformly applied to the connector 12 via the deflecting engagement members 24*a* and 24*b* and jaw members 25*a* and 25*b*. This tongue-and-groove configuration exists generally along a vertical centerline Z of the release device 22 (FIG. 5B) and the rigid press 16 to further ensure proper, uniform force transfer from the rigid press 16 to the release device 22 and ultimately to the connector 12.

The alignment system can further comprise a self-alignment feature. In one example, the grooves 42*a* and 42*b* can each further comprise a flared opening, such as the flared openings 43*a* and 43*b* (see FIG. 4), configured to initially receive the lower ends of respective tongues 40*a* and 40*b* of the rigid press 16. The flared openings 43*a* and 43*b* can function to initially receive a portion of the tongues 40*a* and 40*b* even when the rigid press 16 is not properly aligned with the release device 22. Once a portion of the tongues 40*a* and 40*b* are received within the flared openings 43*a* and 43*b*, respectively, further pressing of the rigid press 16 onto the release device 22 will cause the tongues 40*a* and 40*b* to self-align with the grooves 42*a* and 42*b*, and therefore the rigid press 16 to align with the release device 22. This is achieved as the flared openings 43*a* and 43*b* function to guide the tongues 40*a* and 40*b* past the flared openings 43*a* and 43*b* and further into the respective grooves 42*a* and 42*b* as the rigid press 16 is further pressed onto the release device 22. As the tongues 40*a* and 40*b* are slid further into the narrow portion of the grooves 42*a* and 42*b*, respectively, the rigid press 16 will be brought into a proper alignment with the release device 22 due to the sliding interface between the tongues 40*a* and 40*b* and the grooves 42*a* and 42*b* and the narrowing of the grooves 42*a* and 42*b* past the flared openings 43*a* and 43*b*.

Figure 1C:
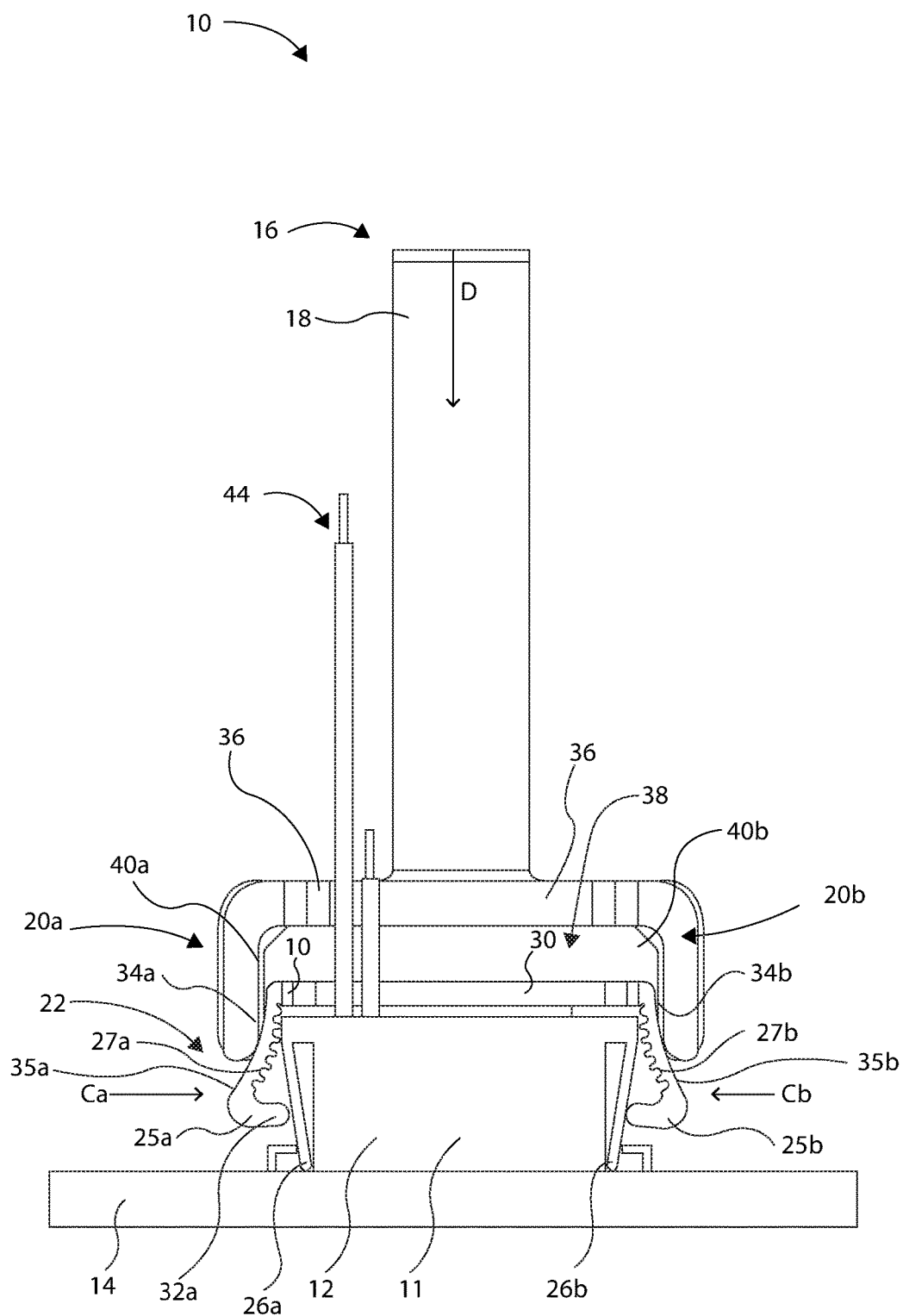
FIG. 1C is a front view of the connector removal tool of FIG. 1A engaged to and unlocking the connector from the electronics assembly.
Figure 2:
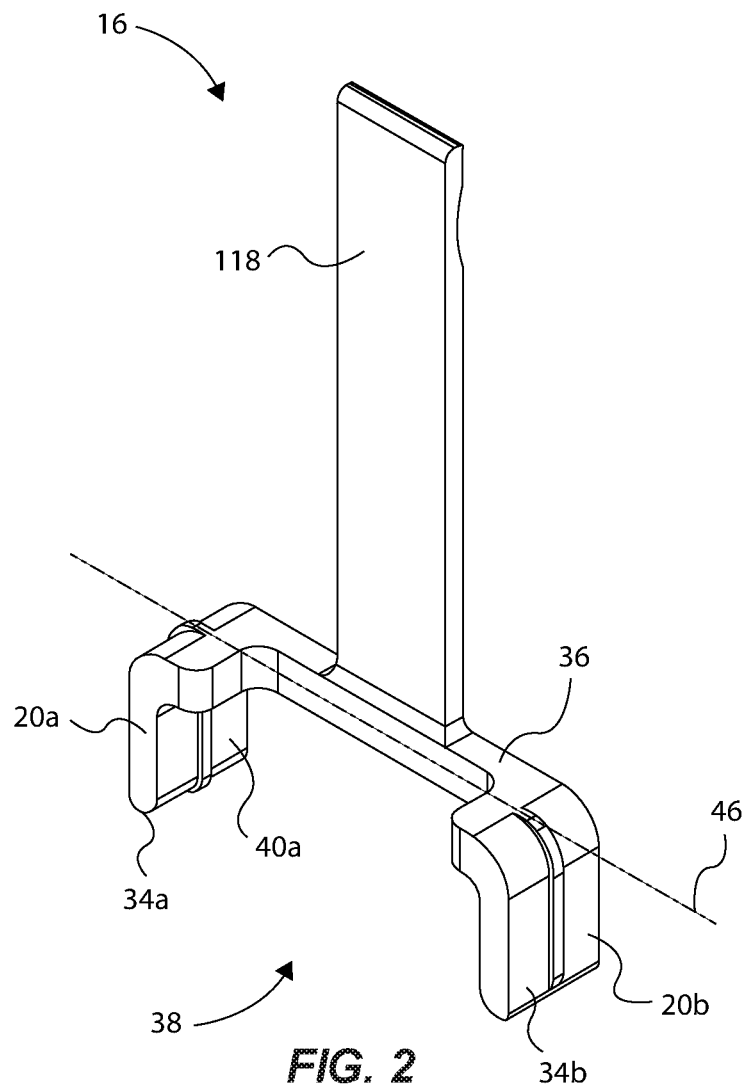
FIG. 2 is an isometric view of the rigid press of the connector removal tool of FIG. 1A.

The connector removal tool 10 can further comprise an off-center configuration to facilitate clearance of any wires 44 coming from the connector 12 and that may extend along the connector removal tool 10 (see FIGS. 1A-1C). The connector 12 can collectively be comprised of a connector body 11 (e.g., a plastic body) and the wires 44 (e.g., a wiring harness coupled to the connector body 11). This off-center configuration can be defined by the middle portion or support bridge 36 of the rigid press 16 being formed spatially away from a lateral center axis X of the rigid press 16 (FIGS. 2 and 3A), to comprise a U-shape configuration. Stated differently, the middle portion or support bridge 36 of the rigid press 16 can be formed and configured to provide or define a channel that can accommodate wires 44 extending out from the connector 12. As a point of reference, the lateral central axis X may extend along the same lateral position of the tongues 40*a* and 40*b*.

Likewise, the middle portion or support bridge 30 of the release device 22 can be formed spatially away from the lateral center axis X at a position that corresponds to, or vertically aligns with, the support bridge 36 of the rigid press 16 (FIG. 1A), to comprise a similar U-shape configuration. The middle portion or support bridge 30 of the release device 22 can be formed and configured to provide and define a channel that can accommodate wires 44. Thus, the rigid press 16 and the release device 22 somewhat laterally straddle the wires 44 in a manner so that the connector removal tool 10 can be interfaced along ends of the connector 12 but without contacting the wires 44. Said another way, the off-center configuration positions the respective support bridges 36 and 30 adjacent a lateral edge of the connector body 11 to define a void or an area or channel through which the wires 44 may pass without interference from the connector removal tool 10. Despite this off-center configuration, the rigid press 16 and the release device 22 remain configured to compress or depress the interlocking tabs 26*a* and 26*b* inwardly, so that the pinching forces applied by the release device 22 ensure proper unlocking and removal of the connector 12.

Clearance of the wires 44 is shown specifically in FIGS. 1A-1C. As can be seen, the wires 44 extend through the channels in the rigid press 16 and the release device 22, such that the connector removal tool 10 is out of contact with the wires 44 while it is being used to grasp and remove the connector 12. As illustrated best in FIG. 1A, the handle portion 18 can be positioned laterally on the same side (e.g., off-center) as the respective middle portions or support bridges 30 and 36. This generates a narrow profile that allows for clearance of the wires 44 about the connector removal device 10. However, the handle portion 18 could comprise other types and take other suitable forms that are also configured to not interfere with the wires 44.

Figure 6:
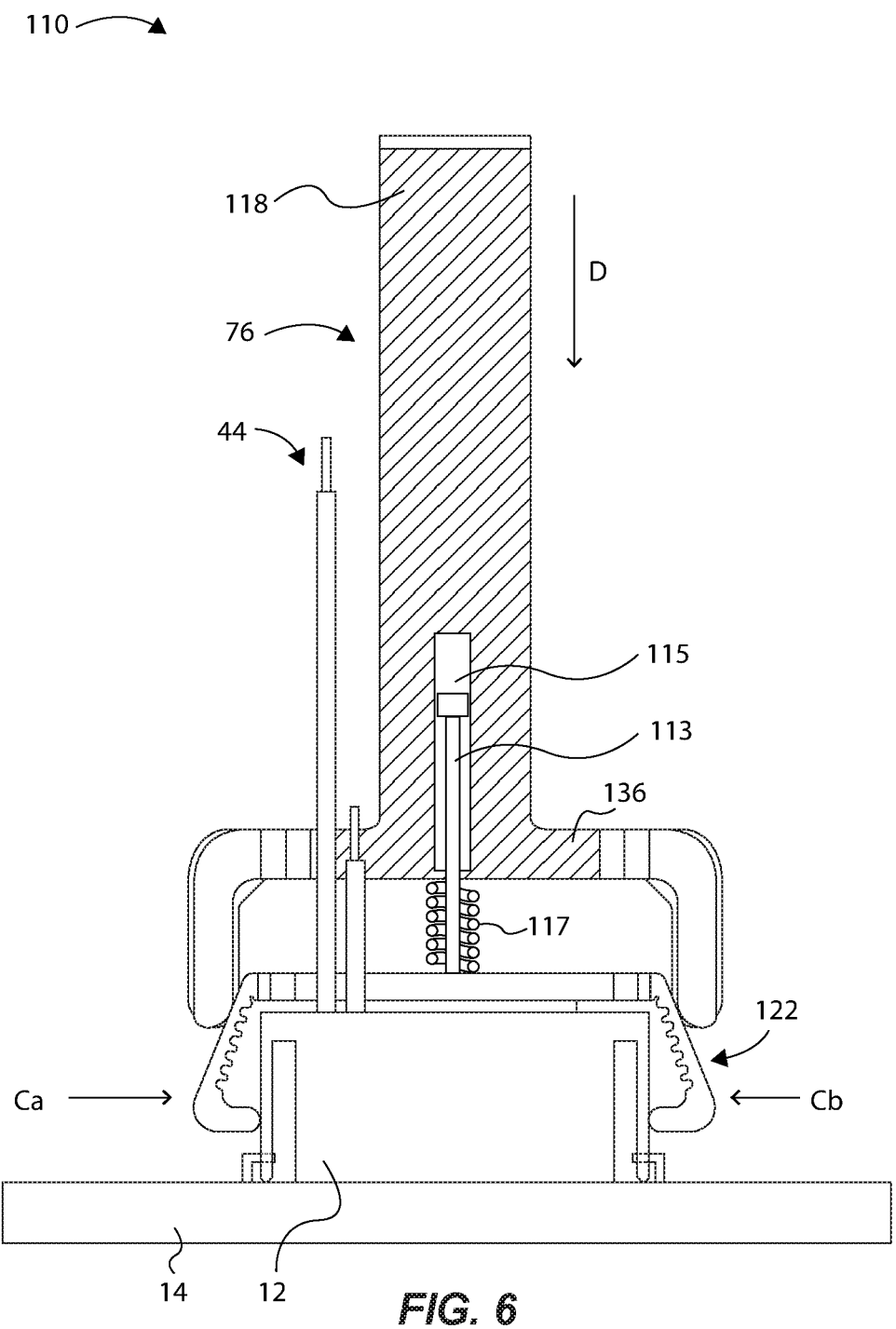
FIG. 6 is a front view of a connector remover tool in accordance with another example of the present disclosure.

FIG. 6 illustrates a connector removal tool operable to remove the connector 12 from the electronics assembly 14 in accordance with another example of the present disclosure. In this example, a connector removal tool 110 can comprise a rigid press 116 and a release device 122. Although different in some respects as explained below, it should be appreciated that the connector removal tool 110 can comprise many of the same or similar features and can function in the same or a similar manner as the example connector removal tool 10 discussed above and shown in FIGS. 1A-5C (such as the press members, deflecting engagement members, jaw members, off-center support bridges, lateral ribs, etc.). Thus, many of the same features described above and shown in FIG. 6 will not be discussed in detail here, but can be referred to above for an understanding of the connector removal tool 110 shown in FIG. 6.

Unlike the connector removal tools discussed above, the connector removal tool 110 of FIG. 6 can comprise a guide rod 113 that can be attached to the release device 122 and that can extend upwardly (in a vertical direction with reference to the orientation of the connector removal tool 110 shown in FIG. 6) therefrom (i.e., along an axis parallel to the pressing direction D of the rigid press 116). The guide rod 113 can be slidably received through a bore or opening 115 formed through the rigid press 116 as the rigid press 116 is brought into contact with the release device 122. Note that only the handle portion 118 and a support bridge 136 are cross-sectioned to show the guide rod 113 extending into the bore or opening 115. The guide rod 113 as received within the bore 115 can function as an alternative type of alignment interface system to ensure proper, alignment of the rigid press 116 and the release device 122 relative to each other as the rigid press 116 is slidably engaged with and pressed onto the release device 122 to remove the connector 12, as further exemplified above.

The connector removal tool 110 can further comprise one or more springs or other elastic components situated between the rigid press 116 and the release device 122 that provide a biasing force between the rigid press 116 and the release device 122. In one aspect, a spring 117 (such as a coil spring, or other elastic component as will be apparent to those skilled in the art) can be positioned or situated between the support bridge 136 of the rigid press 116 and the support bridge 30 of the release device 122, and can surround or otherwise be associated with and can be supported by or about the guide rod 113 to properly seat and orient the spring 117. In another example, two springs can employed and can be seated on different sides of the guide rod 113. In still other examples, the springs may be supported about either of the rigid press 116 or the release device 122 in various different ways and at various positions, such that a biasing force is created between them.

With the rigid press 116 initially disengaged (i.e., no press force is being applied) from the release device 122 and before a press force is applied by the rigid press 116 (FIG. 6), the guide rod 115 can function to guide the rigid press 116 onto the release device 122 in a proper way and to facilitate proper alignment of these components. As the rigid press 116 is pressed onto the release device 122, the guide rod 113 slides within the bore 115, wherein slippage and other unwanted movement of the rigid press 116 relative to the release device 122 is minimized or eliminated due to the interaction of the guide rod with the rigid press 116.

In the example where a spring is employed, the spring 117 can be uncompressed or partially compressed with the rigid press 116 disengaged from the release device 122. With the spring 117 in a partially compressed state, the rigid press 116 can be biased in a direction away from the release device 122. In any event, the spring 117 can be employed and configured to initially permit the rigid press 116 to be disengaged from the release device 122, so that the release device 122 can be properly positioned over the connector 12.

In operation, and once the release device 122 is properly positioned about the connector 12, the rigid press 116 can be caused to be pressed onto the release device 122, in a similar manner as discussed above. Upon movement of the rigid press 116 toward the release device 122 to apply a press force to the release device 122, the spring 117 can compress or further compress as the rigid press 116 slides about the guide rod 113 and along the release device 122, wherein the spring stores potential energy. Similar to the example connector removal tool 10 of FIGS. 1A-5C, as the rigid press 116 is pressed onto the release device 122 in the direction D to apply a press force to the release device 122, the press members 120a and 120b of the rigid press 116 are moved to cause inward deflection of the deflecting engagement members 24a and 24b of the release device 122 in the direction Ca for compression or depression of the interlock tabs of the connector 12 and to grasp and pinch the connector 12, which facilitates removal of the connector 12 from the electronics assembly 14. Once the interlock tabs are unlocked, the rigid press 116 can be moved in the opposite direction to remove the press force. As the rigid press 116 is moved in a direction to remove the press force (i.e., a direction opposite direction D), the spring 117 can release any stored potential energy in the form of a force that is applied to the rigid press 116 to assist in moving the rigid press 116 away and disengaging the rigid press 116 from the release device 122, wherein the release device 122 returns to its normal, disengaged position. With the assistance of the spring 117, the connector removal tool 110 can be automatically moved to its disengaged position and be ready to remove another connector.

In one example, the guide rod 113 can comprise a head portion and the rigid press 116 can comprise a stopper situated in the bore 115, such that the rigid press 116 and the release device 122 can remain connected together via the guide rod 113 (i.e., the guide rod 113 is not removable from the bore 115). Furthermore, and although not required, it is contemplated that an additional alignment interface system (e.g., the tongue and groove interface configuration discussed above) can further be provided for on the connector removal tool 110 in addition to the guide rod 113.

Figure 7:
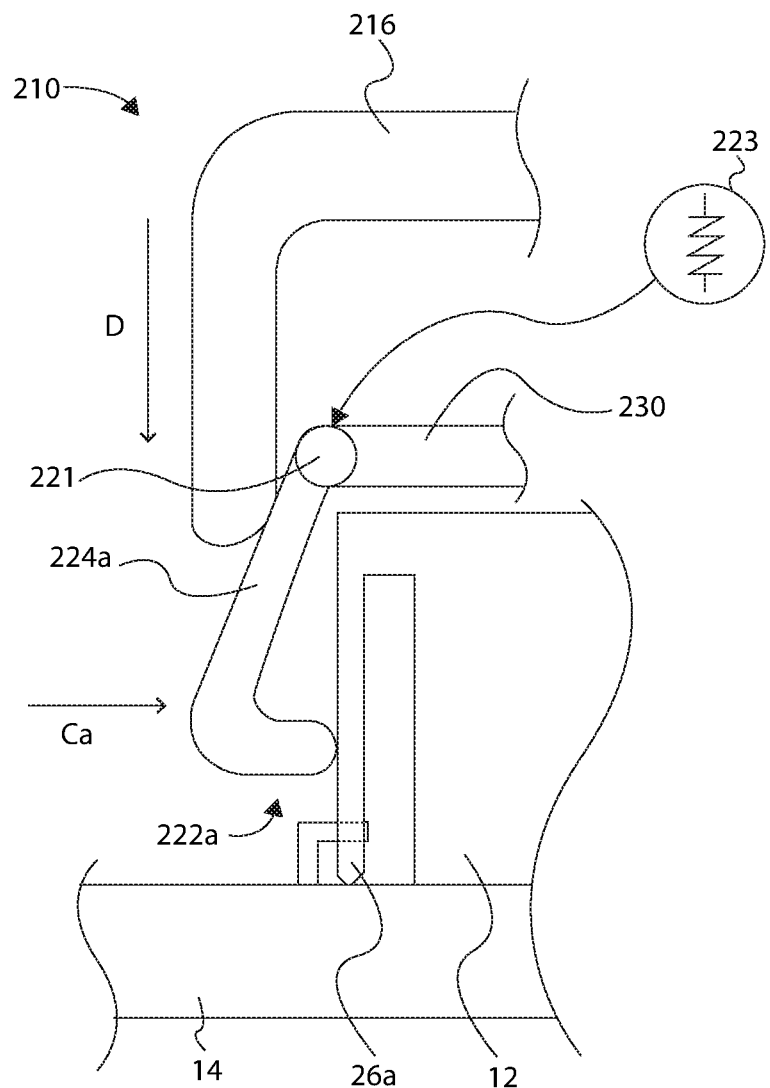
FIG. 7 is a front view of a connector remover tool in accordance with another example of the present disclosure.

FIG. 7 shows another example of a connector removal tool 210 operable to remove the connector 12 from the electronics assembly 14. In this example, the connector removal tool 210 can comprise a rigid press 216 and a release device 222. Note that only a portion of the connector removal tool 210 is shown in FIG. 7 to illustrate this alternative configuration, but it will be recognized that the non-illustrated portions of the connector removal tool 210 can comprise a like configuration. In addition, and although different in some respects as explained below, it should be appreciated that the connector removal tool 210 can comprise many of the same or similar features and can function in the same or a similar way as the example connector removal tools discussed above with respect to FIGS. 1A-6. Thus, many of the same features described above and shown in FIG. 7 will not be discussed in detail here, but can be referred to above for an understanding of the connector removal tool 210 shown in FIG. 7.

Unlike the connector removal tools discussed above, the example connector removal tool 212 of FIG. 7 can comprise a release device 222 that can comprise opposing deflecting engagement members (e.g., one deflecting engagement member 224a being shown) that are separate structural elements from a support bridge 230 (i.e., not integrally formed), and that are pivotally coupled to the support bridge 230 using a coupling pivot device 221 (shown schematically). Specifically, the deflecting engagement member 224a can be coupled to the support bridge 230 of the release device 222 by the coupling pivot device 221 to facilitate pivoting and inward deflection of the deflecting engagement member 224a when the rigid press 216 is pressed downwardly onto the release device 222. In one example, the coupling pivot device 221 can comprise a mechanical hinge or hinge type of device (e.g., a pin and an elastic component 233 (e.g., a spring) operatively coupled together), a compliant hinge or hinge type of device, and others as will be recognized by those skilled in the art. The elastic component 223 is shown schematically, but it could comprise a coil spring, torsional spring, leaf spring or other type of spring coupled to or otherwise operable with the pin, wherein the pin can pivotally couple the deflecting engagement member 224a to the support bridge 230, and wherein the elastic component 223 or spring can apply a spring or biasing force to urge the deflecting engagement member 224a in an outward direction to a non-deflected or disengaged position, or in other words in a direction opposite the arrow Ca shown. Indeed, the elastic component 223 can be pre-loaded to apply a spring force to the deflecting engagement member 224a that tends to push or pivot it outwardly away from the connector 12.

In operation, as the rigid press 216 is brought into contact and engaged with the release device 222, and then pressed onto the release device 222 to apply a press force to the release device 222, as discussed above, the rigid press 216 deflects the deflecting engagement members inward in the direction Ca toward the connector 12. In doing so, the deflecting engagement members pivot about the support bridge 230 via the coupling pivot device 221, acting against the elastic component 223 wherein energy is stored, to contact and depress the interlock tabs (e.g., see interlock tab 26a, the other not being shown) of the connector 12, wherein the interlock tabs are unlocked, and wherein the connector 12 can then be removed. In this manner, after the rigid press 216 is operated with the release device 222 to unlock the interlocking tabs 26a, 26b by downwardly pressing on the rigid press 216 (similarly as described above) the connector 12 can be removed, such as by pulling on the wiring harness. With the connector removed, the rigid press 216 can be disengaged from the release device 222 by moving the rigid press 216 in a direction opposite the direction shown by arrow D, wherein the elastic component 223 can release its stored energy to outwardly push the deflecting engagement member 224a back to its disengaged, non-deflected position so that the connector removal tool 210 can be used to remove another connector (the same being true for the deflecting engagement member not shown).

Figure 8:
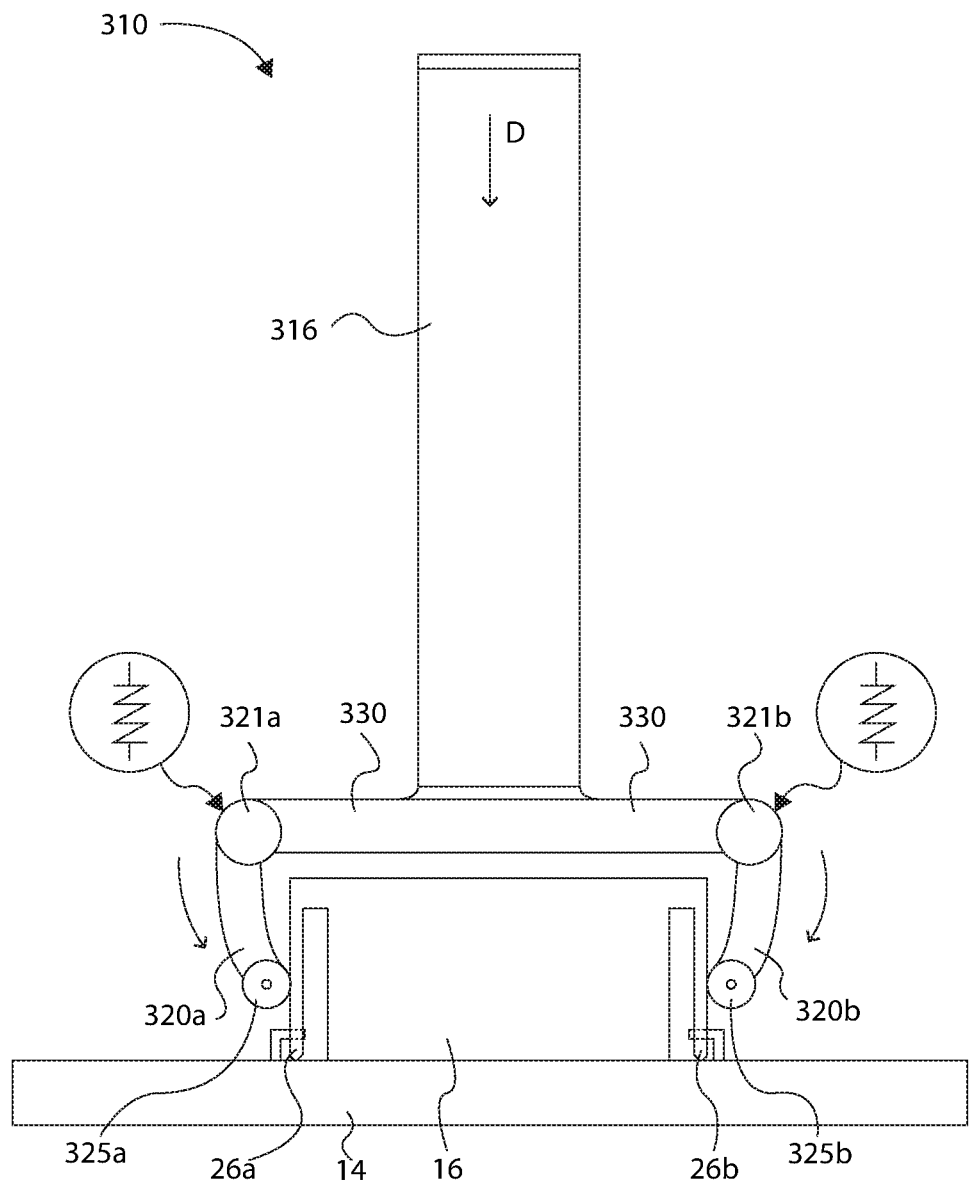
FIG. 8 is a front view of a connector remover tool in accordance with another example of the present disclosure.

FIG. 8 shows another example of a connector removal tool 310 operable to remove the connector 12 from the electronics assembly 14. Although different in some respects as explained below, it should be appreciated that the connector removal tool 310 can comprise many of the same or similar features and can function in the same or a similar way as the example connector removal tools discussed above with respect to FIGS. 1A-7. Thus, many of the same features described above will not be discussed in detail here, but can be referred to above for an understanding of the connector removal tool 310 shown in FIG. 7.

In this example, the connector removal tool 310 comprises only a rigid press 316, and does not include a separate release device structure, such as disclosed above regarding release devices 22, 122, or 222. Here, the connector removal tool 310 comprises a rigid press 316 that functions as a press to apply a press force on the connector 12, and that has a release mechanism that functions to engage with and grasp or pinch the connector 12 for removal from the electronics assembly 14. More specifically, the connector removal tool 310, namely the rigid press 316, comprises a release mechanism having first and second movable, deflecting press members 320a and 320b pivotally supported by and about, and extending from, a support bridge 330 of the rigid press 316. In one example, the deflecting press members 320a, 320b can be integrally formed with the support bridge 330, wherein the deflecting press members 320a, 320b are pivotally coupled to the support bridge 330 via respective coupling pivot devices 321a, 321b in the form of compliant mechanisms that function as hinges. The compliant mechanisms can each comprise an area or portion capable of flexing or bending that facilitates movement or deflection of the deflecting press members 320a, 320b relative to the support bridge 330. In one example, the compliant mechanisms can comprise a flexing area formed by the intersection of the deflecting press members 320a, 320b and the support bridge 330, wherein these are formed of the same material. In another example, the compliant mechanisms can each comprise a flexing area formed of an elastomer or other compliant material coupled to and extending between the support bridge 330 and an end of the deflecting press members 320a, 320b, respectively. In another example, the deflecting press members 320a and 320b can be pivotally coupled to the support bridge 330 via respective coupling pivot devices in the form of mechanical hinges or hinge-like devices or mechanisms, that pivotally couple one end of the respective deflecting press members 320a and 320b to respective ends of the support bridge 330. In one specific example, the first and second deflecting press members 320a and 320b can each be pinned to the support bridge 330 using a pinned connection, which type of connection is known in the art and not described in detail herein. The coupling pivot devices 321a, 321b can each further comprise an elastic element (e.g., a spring, such as a coil spring, a torsional spring, and others) that applies a biasing force against the deflecting press members 320a, 320b, respectively, and that urges the deflecting press members 320a, 320b in an inward direction towards one another.

Despite the type of coupling pivot device utilized, the coupling pivot devices 321a and 321b can be pre-loaded to inwardly bias the first and second deflecting press members 320a and 320b toward one another, and an inward pivot distance of the deflecting press members 320a, 320b can be such that in a non-deflected, resting position, the distance between them is less than a width of the connector 12. Therefore, when the rigid press 316 is applied to the connector 12, the deflecting press members 320a, 320b are caused to pivot or deflect and spread apart from one another a sufficient distance, such that they can deflect inwards back towards one another a sufficient distance to effectively pinch and unlock the interlocking tabs of the connector 12.

Indeed, in operation of the connector removal tool 310, the rigid press 316 can be brought into contact with the connector 12 by moving it toward the connector 12 in the direction denoted by the arrow D, such that the deflecting press members 320a, 320b directly contact and engage the connector 12. Due to the initial inward non-deflected position of the deflecting press members 320a, 320b, and due to the distance between the first deflecting press member 320a from the second deflecting press member 320b being less than a width of the connector 12, the connector removal tool 310 can be manipulated and pressed further onto the connector 12 in the direction D to cause the deflecting press members 320a, 320b to slide across the various surfaces of the connector 12 and to expand or deflect and open (i.e., spread outward apart from one another), wherein the connector 12 is received within the connector removal tool 310 with the deflecting press members 320a, 320b positioned about the sides of the connector 12. The rigid press 316 can be further displaced in the direction denoted by the arrow D and pressed onto the connector 12, such that the deflecting press members 320a, 320b are caused to slide down the sides of the connector 12, and particularly the interlocking tabs 26a and 26b, respectively. Upon reaching a position about the interlocking tabs 26a, 26b, and due to the stored energy within the deflecting press members 320a, 320b as a result of them being deflected over the connector 12, the deflecting press members 320a, 320b can apply a force (i.e., a pinching force) to the interlocking tabs sufficient to compress or depress them, and to unlock them from the electronics assembly 14, thus facilitating removal of the connector 12 from the electronics assembly 14.

In some examples, the first and second deflecting press members 320a and 320b can comprise and support respective rollers or roller devices 325a and 325b that operate to rotatably interface with the connector 12, and which can function to reduce or minimize friction between the rigid press 316 and the connector 12 while engaging the connector removal tool 310 with the connector 12. The rollers or roller devices 325a and 325b can be metallic or plastic rollers that are pinned or otherwise rotatably coupled to the free ends of the respective first and second deflecting press members 320a and 320b. During operation of the connector removal tool 310, as the rigid press 316 is brought into contact and engaged with the connector 12, namely as the deflecting press members 320a and 320b are deflected outward initially to receive the connector 12 within the rigid press 316, and as the deflecting press members 320a, 320b are caused to slide down the sides of the connector 12 and the interlocking tabs 26a, 26b, the rollers 325a, 325b can be caused to roll along the various surfaces of the connector 12 as the connector removal tool 310 is pressed onto the connector 12. For example, the rollers 325a, 325b can be caused to roll about a top surface of the connector 12 during initial outward deflection of the deflecting press members 320a and 320b. Once the deflecting press members 320a and 320b are sufficiently deflected, such that the connector removal tool 310 engages with the connector 12, the rigid press 316 can be pressed further onto the connector 12, as discussed above, wherein the rollers 325a, 325b roll down the sides and the interlocking tabs 26a, 26b of the connector 12 as the interlocking tabs 26a, 26b are compressed or depressed and unlocked to facilitate removal of the connector 12.

It is to be understood that the examples of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular examples only and is not intended to be limiting.

Reference throughout this specification to "one example" or "an example" means that a particular feature, structure, or characteristic described in connection with the example is included in at least one embodiment of the present invention. Thus, appearances of the phrases "in one example" or "in an example" in various places throughout this specification are not necessarily all referring to the same example.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more examples. In the description, numerous specific details are provided, such as examples of lengths, widths, shapes, etc., to provide a thorough understanding of examples of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A connector removal tool for removing a connector from an
   electronics assembly, comprising:
   a rigid press comprising a handle portion, and first and second press members supported about the handle portion; and
   a release device engageable with the rigid press, and comprising a pair of deflecting engagement members opposing each other,
   wherein the rigid press is operable to engage the release device and to cause the first and second press members to interface with and slide about the pair of deflecting engagement members in response to the rigid press being moved along a linear path toward the connector and onto the pair of deflecting engagement members, such that the rigid press applies a press force to the release device sufficient to cause the pair of deflecting engagement members to deflect inwardly towards one another, the release device being operable to inwardly compress a pair of interlocking tabs of the connector to facilitate release of the connector from an electronics assembly.

2. The connector removal tool of claim 1, wherein the pair of deflecting engagement members are each bendable along an axis and sufficiently compliant to maintain a linear, axial deflection displacement upon movable engagement of the release device with the rigid press.

3. The connector removal tool of claim 2, wherein each of the pair of deflecting engagement members comprise a cross-sectional area of variable thickness that facilitates the axial deflection displacement.

4. The connector removal tool of claim 3, wherein the cross-sectional area of variable thickness is defined by a plurality of ribs formed into the deflecting engagement members.

5. The connector removal tool of claim 1, wherein the release device comprises a wedge-shaped body having a support bridge extending between the pair of deflecting engagement members, and wherein the deflecting engagement members extend from the support bridge along diverging axes.

6. The connector removal tool of claim 5, wherein the support bridge of the release device comprises an off-center configuration or position to facilitate clearance for a wiring harness extending from the connector.

7. The connector removal tool of claim 6, wherein the rigid press comprises a support bridge extending between the pair of press members, the support bridge of the rigid press comprising an off-center configuration corresponding to the off-center configuration of the support bridge of the release device, to further facilitate clearance for the wiring harness about the connector remover tool.

8. The connector removal tool of claim 1, further comprising an alignment interface system between the rigid press and the release device to facilitate alignment of the rigid press relative to the release device.

9. The connector removal tool of claim 8, wherein the alignment interface system comprises a tongue-and-groove interface configuration.

10. The connector removal tool of claim 8, wherein the alignment interface system comprises a guide rod extending from the release device into an opening of the rigid press, wherein the guide rod is translatable through the opening.

11. The connector removal tool of claim 1, wherein the connector remover tool is configured to be movable between an engaged position and a compressed position, wherein the press members are movable along the pair of deflecting engagement members as the rigid press is pressed onto the release device.

12. The connector removal tool of claim 1, wherein the release device further comprises a pair of coupling pivot devices pivotally coupling the pair of deflecting engagement members to the support bridge, respectively.

13. The connector removal tool of claim 12, wherein the pair of coupling pivot devices each comprise an elastic component operable to apply a biasing force to urge the respective deflecting engagement members away from one another.

14. A system for removing a connector from an electronics assembly with a connector removal tool, the system comprising:
 an electronics assembly;
 a connector having a pair of interlocking tabs opposing each other and removably interlocked to a portion of the electronics assembly; and
 a connector removal tool comprising:
  a rigid press having a handle portion, and first and second press members supported about the handle portion; and
  a release device positioned about the connector, and having a pair of deflecting engagement members each positioned against one of the interlocking tabs of the connector;
  an engaged position, wherein the rigid press engages the release device to cause the first and second press members to interface with and slide about the pair of deflecting engagement members; and
  a compressed position, wherein the rigid press is pressed onto the release device along a linear path towards the connector and onto the pair of deflecting engagement members to cause the pair of deflecting engagement members to deflect inwardly and compress the pair of interlocking tabs of the connector with sufficient force to unlock the interlocking tabs, thereby facilitating removal of the connector from the electronics assembly.

15. The system of claim 12, wherein the connector comprises a connector body and a wiring harness extending from the connector body, wherein the rigid press and the release device each comprise an off-center support bridge configured to collectively facilitate clearance of the wiring harness about the connector removal tool.

16. The system of claim 12, wherein the deflecting engagement members deflect in proportion to a displacement distance of the rigid press.

17. A connector removal tool for removing a connector from an electronics assembly, comprising:
 a rigid press comprising a handle portion and a support bridge;
 a first deflecting press member and a second deflecting press member pivotally supported about the support bridge in an opposing position relative to one another;
 a first coupling pivot device operable with the first deflecting press member;
 a second coupling pivot device operable with the second deflecting press member, wherein the first and second coupling pivot devices bias the first and second deflecting press members toward one another, respectively,
 wherein the rigid press is operable to engage directly with a connector coupled to an electronics assembly, such that the first and second deflecting press members interface with and compress respective interlocking tabs of the connector with sufficient force to remove the connector from an electronics assembly in response to moving the rigid press along a linear path and sliding the first and second deflecting press members along the interlocking tabs.

18. The connector removal tool of claim 17, further comprising a pair of roller devices coupled to the first and second deflecting press members, respectively, the roller devices being operable to facilitate rotatable interfacing of the first and second deflecting press members with the connector.

19. A method for removing a press-fit connector from an electronics assembly using a connector remover tool, the method comprising:
 positioning a release device of the connector removal tool about a connector removably coupled to an electronics assembly, the release device having pair of deflecting engagement members interfaced with a pair of interlocking tabs of the connector;
 engaging a rigid press of the connector removal tool with the release device, the rigid press having first and second press members slidably engaged with the pair of deflecting engagement members of the release device; and pressing the rigid press onto the release device toward the connector and along a linear path toward the connector, such that the first and second press members slide about the pair of deflecting engagement members and cause inward deflection of the pair of deflecting engagement members to compress the interlocking tabs of the connector with sufficient force to unlock the interlocking tabs from an electronics assembly and to facilitate removal of the connector from the electronics assembly.

20. The method of claim 19, wherein pressing the rigid press onto the release device to remove the connector comprises translating the rigid press toward the connector.

21. The connector removal tool of claim 1, wherein the pair of deflecting engagement members each comprise a connector interface surface for interfacing with respective interlocking tabs, wherein the connector interface surfaces move inwardly toward each other in response to the rigid press being moved along the linear path toward the connector and onto the pair of deflecting engagement members.

22. The connector removal tool of claim 21, wherein the release device comprises a support bridge that extends between and couples together the pair of deflecting engagement members, the release device comprising opposing pivot points proximate ends of the support bridge and respective deflecting engagement members, wherein the first and second press members define slidable interfaces along respective outer surfaces of the pair of deflecting engagement members, and wherein the slidable interfaces are situated vertically between the pivot points and the connector interface surfaces.

* * * * *